United States Patent [19]

Nakao et al.

[11] 4,019,175
[45] Apr. 19, 1977

[54] PROGRAM CHANGEABLE SEQUENCE CONTROLLER

[75] Inventors: Hisaji Nakao, Toyota; Yasufumi Tokura, Kariya; Kazuo Matsuno, Okusa; Toshihiko Yomogida, Kariya, all of Japan

[73] Assignees: Toyoda Koki Kabushiki Kaisha; Toyota Jidosha Kogyo Kabushiki Kaisha, both of Japan

[22] Filed: Apr. 15, 1975

[21] Appl. No.: 568,249

[30] Foreign Application Priority Data

Apr. 18, 1974 Japan .............................. 49-43652

[52] U.S. Cl. .......................................... 340/172.5
[51] Int. Cl.² ......................................... G05B 19/18
[58] Field of Search ............................. 340/172.5

[56] References Cited

UNITED STATES PATENTS

| | | | |
|---|---|---|---|
| 3,686,639 | 8/1972 | Fletcher et al. | 340/172.5 |
| 3,753,243 | 8/1973 | Ricketts et al. | 340/172.5 |
| 3,798,612 | 3/1974 | Struger et al. | 340/172.5 |

*Primary Examiner*—R. Stephen Dildine, Jr.
*Attorney, Agent, or Firm*—Oblon, Fisher, Spivak, McClelland & Maier

[57] ABSTRACT

A programmable sequence controller is disclosed which includes a controller memory having at least one read-only memory unit for storing a sequence program comprising a series of instructions each including an operation code and address information. An operation control device is also provided for examining an external input in accordance with an appropriate instruction. An input network permits application of external inputs designated by the address information to the operation control device, and an output network is provided for transmitting a control signal based on the examination result from the operation control device. A program input network including a read-write memory is provided for storing a part of the sequence program, which part is loadable in one read-only memory unit. A program changing device is provided for changing the partial sequence program loaded in the read-write memory, and a transfer system is included for immediately transferring the changed sequence program into a read-only memory unit.

16 Claims, 3 Drawing Figures

PROGRAM CHANGEABLE SEQUENCE CONTROLLER

BACKGROUND OF THE INVENTION

1. Field of the Invention

The present invention relates to a sequence controller and more particularly relates to a program changeable sequence controller wherein a read-only memory, which is capable of erasing a program therein, is employed as a program memory medium and the loading of the program into the read-only memory and the change thereof are quickly and easily performed.

2. Description of the Prior Art

Conventional sequence controllers are provided with a read-write memory as a major controller memory and therefore, it is possible to directly load a predetermined portion of a program or to change the program. However, the read-write memory is generally a core memory in which the instructions are erased at each read-out operation. Therefore, the program is prone to be damaged due to normal environmental hazards. Furthermore, the required control circuit of such systems is complex and the core memory is expensive.

In another type of conventional sequence controller, a read-only memory in which the program can be erased using either external electrical circuitry, or by the application of ultraviolet light is utilized as a major controller memory. Such sequence controllers, however, are operated by means of a read-write memory for a first operating cycle and, when the program is perfected, the program is transferred to the read-only memory for permanent use. In this case, the capacity of the read-write memory should be made as large as the whole read-only controller memory, which becomes expensive. Additionally, the read-write memory is susceptible to electrical noise and thus the program therein is also prone to be damaged while the controller is operated by means of the read-write memory. Once the program is damaged, the entire program should be corrected or at least examined to test it for failures.

It will be understood by those skilled in the art that it is possible in a program erasable read-only memory to erase all of the program at one time, but impossible to erase a part thereof.

SUMMARY OF THE INVENTION

It is, therefore, an object of the present invention to provide a sequence controller which can accomplish a program change without changing all of the program.

Another object of the present invention is to provide a sequence controller which employs a read-only memory as a major controller memory, but still permits program change.

Still another object of the present invention is to provide a sequence controller which is not influenced by electrical noise.

A further object of the present invention is to provide a sequence controller wherein program changes can be performed by means of a read-write memory of minimum capacity.

Briefly, these and other objects are attained according to the present invention, wherein a part of a program to be changed is shifted to a read-write memory of a program input device from a memory device of the sequence controller. A read-only memory unit which contains the part of program to be changed is removed from the memory device. The memory address of the program stored in the read-write memory is selected by means of the program input device and new instructions are loaded into the selected memory address. Thereafter, the changed program is shifted to a read-only memory unit coupled to a plug-in socket of the program input device. The read-only memory unit loaded with the changed program is again coupled to the memory device to be utilized as part of the memory device.

BRIEF DESCRIPTION OF THE DRAWINGS

The exact nature of this invention, as well as other objects and advantages thereof, will be readily apparent from consideration of the following specification relating to the annexed drawing in which.

DETAILED DESCRIPTION OF THE PREFERRED EMBODIMENT

Figure 1:
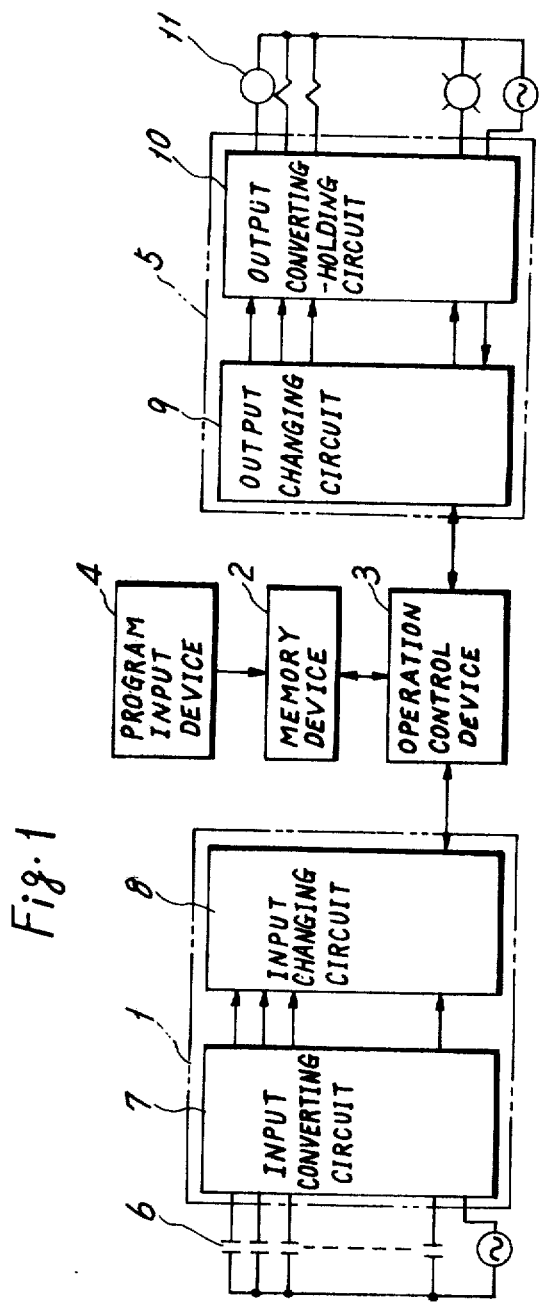
FIG. 1 is a block diagram of a sequence controller according to the present invention.

A preferred embodiment of the present invention will now be described with reference to the accompanying drawings, wherein like reference numerals designate identical or corresponding parts throughout the several views and more particularly to FIG. 1 which shows a block diagram of a sequence controller. The sequence controller according to the present invention comprises an input unit 1, a memory device 2, an operation control device 3, a program input device 4 and an output unit 5. The input unit 1 includes an input converting circuit 7 and an input changing circuit 8. The input unit 1 is connectable to input contacts 6 so that status signals therefrom (i.e., ON or OFF) are corrected in waveshape so as to be converted into logic status signals (i.e., ONE or ZERO). The input changing circuit 8 selects one of the input contacts in response to a selection signal from the operation control device 3 and transfers the logic status signal (ONE or ZERO) of the selected input contact to the operation control device 3. A memory device 2 which consists of a read-only controller memory can store a sequence program loaded by a program input device 4. The read-only memory is a type of integrated circuit (IC) memory and is capable of erasing or eliminating the program loaded therein by using either external electrical circuitry or the application of ultraviolet light directly thereto. The operation control device 3 examines input conditions in accordance with the sequence program loaded into the memory device 2 and supplies output signals to the output unit 5 in a controlled order. The output unit 5 includes an output changing circuit 9 and an output converting-holding circuit 10. The output changing circuit 9 selects one of a plurality of output devices 11 in accordance with an output signal from the operation control device 3. At the same time, the output changing circuit 9 transmits the status of the output devices 11 to the operation control device 3. The output converting-holding circuit 10 is operated in accordance with the output signal from the operation control device 3 and may store the output signal therein and also amplifies electric current supplied to the output devices 11. The output devices 11 are, of course, connectable to the output converting-holding circuit 10.

The manner of storing the sequence program in the memory device 2 will now be described in detail. In this embodiment, each address in the memory device 2 consists of 16 bits or one word. Five bits of the word are utilized for an operation code and the remaining 11 bits are utilized to identify an input/output address or address information. Accordingly, the operation code and the input/output address can be contained in one word.

TABLE 1

| Memory Address | Operation Code | Input/output Address | |
|---|---|---|---|
| 001 | TNO | 10 | (CR1) |
| 002 | TNE | 20 | (CR4) |
| 003 | TFA | 11 | (CR2) |
| 004 | TNA | 13 | (CR3) |
| 005 | YON | 20 | (CR4) |

Figure 3:
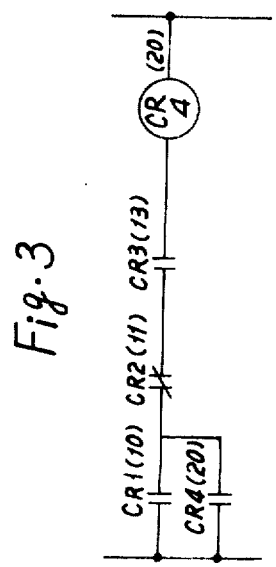

Table 1 shows the manner of storing in the memory device 2 a ladder program of the type shown in FIG. 3. The sequence program of the memory device 2 is successively cyclically read out word-by-word and executed successively in the operation control device 3. The instruction in the 001 memory address is an instruction to examine a contact CR1 connected to 10th input terminal by the logical OR function, if the same is ON, and to store the examination result in a 1 bit register which is referred to as a logical OR function test flag. The instruction in the 002 memory address is an instruction to examine a contact CR4 connected to the 20th input terminal by the logical OR function, if the same is ON, and to store the examination result in the logical OR function flag and to shift the examination results on the contacts CR1 and CR4 from the OR function flag to an AND function flag. The instruction in the 003 memory address is an instruction to examine by the logical AND function whether the contact CR2 connected to the 11th input terminal is OFF and to store the examination result in the AND function flag. Similarly, the instruction in the 004 memory address is an instruction to examine by the logical AND function whether the contact CR3 connected to the 13th input terminal is ON and to store the examination result in the AND function flag. The instruction in the 005 memory address is an instruction to energize a relay circuit CR4 connected to output terminal 20 when the examination result stored in the AND function flag is satisfied and not to energize the relay circuit CR4 when the same is not satisfied. In this manner, the logic status of the input signals are examined in accordance with the sequence program stored in the memory device 2 so as to control the operations of the output devices 11.

Figure 2:
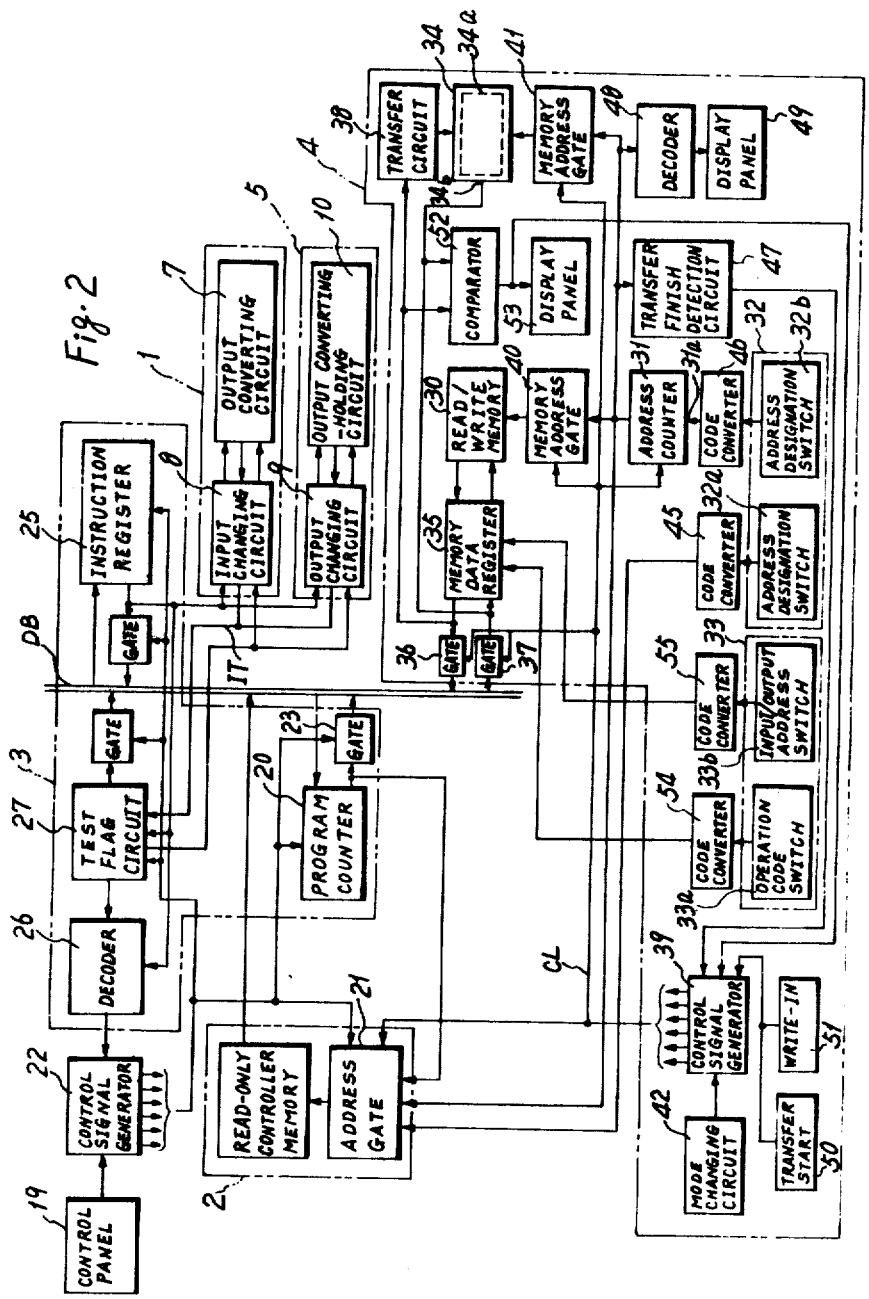
FIG. 2 is a detailed block diagram of the operation control device and program input device of the present invention; and, FIG. 3 is an exemplary ladder diagram.

FIG. 2 shows in detail a block diagram of the control device 3 and the program input device 4. The memory address number or memory address of the sequence program stored in the memory device 2 is designated through an address gate 21 by means of a program counter 20. The program counter 20 is capable of shifting the memory address incrementally by one in response to clock signals supplied from a control signal generator 22. The program counter 20 can count to the highest number of memory addresses in the memory device 2, and the instruction stored in the memory address, which is designated by the program counter 20, is read out when the address gate 21 is opened by the clock signal from the control signal generator 22. A jumped memory address may be preset in the program counter 20, and thus the sequence can be jumped over to a subroutine or returned from the subroutine. In general, the instructions in the memory device 2 are successively cylically read out from the beginning thereof and the read-out instructions are transferred through a data bus DB to an instruction register 25 to be stored therein. In the instruction register 25, the first 5 bits are utilized for the operation code and the remaining 11 bits are used for input-output address or memory address. The operation code is supplied through a decoder 26 into the control signal generator 22 so that the same may generate control signals to perform logic calculations. The input-output address is supplied to the input changing circuit 8 of the input unit 1 or the output changing circuit 9 of the output unit 5 so that one of the input contacts or one of the output contacts may be selected. The operation control device 3 may perform such operations as data shift from register to register by opening gates and performing logic calculations in response to the control signals from the control signal generator 22. The control signals are as mentioned above, generated by the operation code decoded by the decoder 26. The execution process directed by one word of the sequence program is started with the opening of the address gate 21 and the reading out of the instruction in the memory address designated by the program 20. The instruction is stored, at first, in the instruction register 25 and the operation code therein is instantaneously decoded. If the operation code is that of the examination, the address data is supplied either to the input changing circuit 8 or the output changing circuit 9 so as to select one address designated thereby. The logic status of the input contact which is selected by the input changing circuit 8 is transferred into the test flag circuit 27 through a line IT. The test flag circuit 27 may perform a logic calculation in accordance with the logic status signal supplied through the line IT and the command decoded from the operation decoded from the operation code by the decoder 26. The test flag circuit comprises, for example, a flip-fop for storing the result of a logical AND function, a flip-flop for storing the result of a logical OR function, and a flip-flop set only when a logical OR function is performed. In output command execution, the result of the examination stored in the test flag circuit 27 is transferred to the output address designated by the output changing circuit 9 so as to control the operation of the output device 11 through the output converting-holding circuit 10 and further to store the output status in a flip-flop therein. It is to be noted here that the output converting-holding circuit 10 may transfer the status of the output device corresponding to the designated output address to the test flag circuit 27.

The program input device 4 is connectable with the operation control device 3 and comprises read-write (R/W) memory 30, address counter 31, address designation switch 32, program input switch 33 and plug-in memory socket 34. The R/W memory 30 is connectable with the data bus line DB through memory data register 35, and gates 36, 37. The plug-in memory socket 34 is connected to the memory data register 35 through a transfer circuit 38. The R/W memory 30 and the plug-in memory socket 34 are connected to the address counter 31 through respective memory address gates 40, 41 so that the memory addresses are designated thereby. The address counter 31 is also connectable to the address gate 21 of the memory device 2 and furthermore, any memory address in the memory device 2 can be designated through an address designation switch 32a. Another address designation switch 32b is connected to the input terminal 31a of the address counter 31 so as to designate the memory address thereby and furthermore, the memory addresses may be shifted incrementally by one by applying clock signals to the address counter 31. Input switches 33a and 33b, which are respectively used for presetting operation code and input/output address, are connected through code converters 54, 55 to the memory data register 35 so as to write or rewrite the sequence program on the R/W memory 30. A control signal generator 39 is capable of generating various control signals which are sent out through a clock line CL, the various control signals being utilized for writing or rewriting the programs by the program input device 4. The clock line CL is connectable to the address gate 21 of the memory device 2. A mode circuit 42 is connected to the input terminal of the control signal generator 39 so as to change the operation mode of the program input device 4.

The read-only controller memory of the memory device 2 consists, for example, of memory elements, each of which has a capacity of 256 words of 8 bits each. Two memory elements are lumped together in one unit. Accordingly, the capacity of 1K words of 16 bits each requires 4 such units. The address designation switch 32a is utilized to select any one of 4 such units and another address designation switch 32b is utilized to designate the memory address in the selected unit. The address counter 31 consists of an 8 bit counter and may count up to 256 words. Accordingly, the capacity of 256 words of 16 bits each is sufficient for the R/W memory 30.

The five operating modes of the program input device 4 are as follows:

a. First Transfer Mode

The program is read out from the read-only controller memory of memory device 2 and is transferred to the R/W memory 30. This mode is utilized when part of the program is required to be changed.

b. Second Transfer Mode

The program loaded in the R/W memory 30 is transferred into the read-only memory unit 34a at the plug-in memory socket 34. This mode is utilized to transfer the program partly rewritten or newly rewritten in the R/W memory 30 to the read only memory unit 34a at the plug-in memory socket 34.

c. Third Transfer Mode

The content stored in the read-only memory unit 34a at the plug-in memory socket 34 is transferred into the R/W memory 30. This mode is similar to the first mode and is utilized to change the program stored in the read-only memory unit 34a. In order to perform such a change, it is necessary to take out the read-only controller memory unit from the memory device 2 and plug-in the same on the plug-in memory socket 34.

d. Write-In Mode

In this mode, the program is written into the R/W memory 30 by designating the memory address into which the program is to be written. Accordingly, the entire program can be changed when the memory address is successively designated from the starting one and, of course, any part of the program can be changed by designating the relevant memory address.

e. Transfer Check Mode

In this mode the mistakes in the program transferred to the read-only memory unit 34a are examined by comparing the program in the R/W memory 30 with the program in the read-only memory unit 34a at the plug-in memory socket 34.

The process in which a part of the program stored in the device 2 is changed by appropriately selecting the above mentioned operation modes is described below.

In the first step, the first transfer mode is selected through the mode changing circuit 42. Thereafter, one read-only controller memory unit is designated by means of the address designation switch 32a. The designation code from the address designation switch 32a is decoded by the code converter 45. When the first memory address is designated by means of the address designation switch 32b, the address designation code is decoded by means of the code converter 46 and thereafter, preset into the address counter 31. In this case, all of the bits in the address counter 31 are preset to ZERO. When a transfer start button 50 is pressed, the control signal generator 39 supplies clock signals to the address counter 31 so as to count up in response to every one of the clock signals. When data consisting of 256 words has been completely transferred from the read-only controller memory unit to the R/W memory 30 and thus, all of the bits of the address counter 31 have been set to ONE, a transfer finish detection circuit 47 supplies a detection signal to the control signal generator 39 to thereby stop the supply of control signals. In this manner, the program stored in the read-only controller memory unit is transferred without any alteration into the R/W memory 30 unit by unit (256 words total). The program transferred to the R/W memory 30 can be rewritten in the manner described below.

The mode changing circuit 42 is switched to the write-in mode. Thereafter, the memory address to be changed is designated at the address designation switch 32b, new instructions, i.e., an operation code and input/output address, are respectively preset with operation switch 33a and input/output switch 33b. When a write-in button 51 is pressed in this situation, the instructions preset at the switches 33a and 33b are transferred into the memory data register 35 and thereafter, the instructions are transferred to the designated memory address in the R/W memory 30 so as to thereby substitute the new instructions for the ones previously registered therein. Similarly, other portions of the program can be changed by merely presetting the memory addresses and new instructions at the address designation switch 32b and the switches 33a, 33b respectively. It is to be noted here that the memory address preset in the address counter 31 is decoded by a decoder 48 so as to display the same on a display panel 49.

As understood from the above description, all or part of the program transferred to the R/W memory 30 can be arbitrarily changed. It is to be appreciated that new instructions can be loaded into the R/W memory 30 in the same process as the program changing process. After the program change is completed in the R/W memory 30, the second transfer mode is set in the mode changing circuit 42. The read-only memory unit, which has been erased using either external electrical circuitry or the application of ultraviolet light, is mounted to the plug-in memory socket 34 and thereafter, the first memory address is set with the address designation switch 32b. When the transfer start button 50 is again pressed in this situation, the program stored in the R/W memory 30 is successively read out and transferred to the memory data register 35, and thence to the read-only memory unit mounted at the plug-in socket 34 through the transfer circuit 38 so as to load the changed program therein.

In the second transfer mode, the contents of the address counter 31 are applied only to the address gates 40 and 41 since the address gate 21 can be made inoperative. The transfer circuit 38 is capable of converting the program stored in the memory data register 35 into electric signals suitable for loading the program of 16 bits per word into the read-only memory unit 34a at the plug-in memory socket. After each word of the program has been transferred, the control signal generator 39 supplies clock signals to the address counter 31 so as to shift the memory address incrementally by one. When the entire program of 256 words has been completely transferred, the transfer finish detection circuit 47 supplies a detection signal to the control signal generator 39 so that the same may stop the flow of control signals. The transfer check mode is then selected at the mode changing circuit 42 so that the program loaded into the read-only memory unit 34a may be checked. When transfer of the program is completed, the address counter 31 is reset and counts up incrementally by one in response to the clock signals so as to successively and simultaneously designate the memory addresses of the R/W memory 30 and the read-only memory unit 34a. The instructions read out from the designated memory addresses are supplied through respective output terminals to a comparator 52 so as to examine whether the instruction from the R/W memory 30 is the same as the instruction from the read-only memory unit 34a. In this manner, the mistakes in the program transferred into the read-only memory unit 34a are checked. If there should be any mistake, the comparator 52 supplies a non-coincidence signal to the control signal generator 39 and a display panel 53 so that the former may stop the flow of clock signals and the latter may display the mistake.

The third transfer mode is also available in order to accomplish program changes. In this case, the read-only controller memory unit in which the program is required to be changed is removed from the memory device 2 and is mounted to the plug-in memory socket 34. When the transfer start button 50 is pressed after presetting the first memory address on the address designation switch 32b, the program read out through the output terminal 34b of the plug-in memory socket 34 is transferred to the memory data register 35, and thence again transferred to the R/W memory 30. This transfer operation is performed word by word and controlled by the clock signals from the control signal generator 39 to the address counter 31. When the transfer operation of 256 words is completed, the transfer finish detection circuit 47 generates the detection signal as described above. The processes for changing the program and for transferring the changed program to the read-only memory 34a are exactly the same as before.

The read-only memory unit 34a, loaded with a new or partly changed program, is removed from the plug-in memory socket 34 and is again mounted on the memory device 2. When an operation start signal is applied through a control panel 19, the program is read out word by word from the read-only controller memory in the memory device 2 and thus, various operations are executed.

An examination is performed in accordance with the sequence program if the input conditions to the sequence controller are satisfied, and thereafter, if satisfied, the sequential operations of the various output devices are performed.

According to the present invention a read-only memory, in which the program can be eliminated or changed by either external electrical circuitry or the application of ultraviolet light, is employed as a memory unit. Program changes are easily and correctly accomplished since the program stored in the read-only memory can be transferred into a read/write memory of the program input device 4 to be changed therein. Furthermore, the read-only memory utilized in the sequence controller according to the present invention can be handled on a unit by unit basis in order to eliminate the program so that the read-only memory is re-programmable on a unit by unit basis and furthermore, the read-only memory unit can be repeatedly utilized so as to reduce the cost.

Obviously, many modifications and variations of the present invention are possible in light of the above teachings. It is therefore to be understood that within the scope of the appended claims the invention may be practiced otherwise than as specifically described herein.

What is claimed as new and desired to be secured by letters patent of the United States is:

1. A program input device for a programmable sequence controller having controller memory means capable of removably containing at least one read-only memory for storing a sequence program comprising a series of instructions, input means for selecting external inputs connected thereto in accordance with the instructions, operation control means for examining the selected external inputs in accordance with the instructions, and output means for selectively operating external outputs connected thereto in accordance with the instructions and with the results of the examinations, the program input device comprising:
   a read-write memory capable of storing the sequence program,
   connecting means connectible to the read-only memory removed from the controller memory means,
   program transfer means coupled to the read-write memory and the connecting means for transferring the sequence program from the read-only memory to the read-write memory in a first transfer mode and from the read-write memory to the read-only memory in a second transfer mode,
   program changing means for changing the sequence program loaded into the read-write memory, and
   switchable mode changing means for causing the program transfer means to operate selectively in the first and second transfer modes.

2. A program input device according to claim 1 wherein the connecting means comprises a plug-in memory socket for removably mounting the read-only memory for connecting therethrough the read-only memory to the program transfer means.

3. A program input device according to claim 1 wherein the program transfer means comprises memory address designation means coupled to the read-write memory and to the connecting means for simultaneously designating memory addresses of the same number in the read-write memory and in the read-only memory connected to the connecting means whenever any one of the transfer modes is selected.

4. A program input device according to claim 1 wherein the program transfer means is connectible to the controller memory means and a data line of the sequence controller for transferring the sequence program from the read-only memory contained in the controller memory means to the read-write memory in a third transfer mode, the data line transmitting therethrough the sequence program read-out from the read-only memory, and wherein the mode changing means is further selectable to the third transfer mode for operating the program transfer means in the third transfer mode.

5. A program input device according to claim 4 wherein the program transfer means comprises first address designation means connected to the read-write memory and to the connecting means and connectible to the controller memory means for simultaneously designating memory addresses of the same number in the read-write memory and in the read-only memory connected to the connecting means when the mode changing means is selected to any one of the first and second transfer modes and of the same number in the read-write memory and in the read-only memory contained within the controller memory means when the mode changing means is selected to the third transfer mode.

6. A program input device according to claim 5 wherein the controller memory means is capable of removably containing in addition to the read-only memory another read-only memory for storing another sequence program, and wherein the program transfer means further comprises second address designation means for designating any one of the read-only memories contained within the controller memory means in the third transfer mode.

7. A program input device according to claim 6 wherein the first address designation means comprises memory address gate means coupled to the read-write memory and to the connecting means, a presettable address counter connected to the memory address gate means and connectible to the controller memory means for supplying thereto address information, and an address designation switch for presetting the address information into the address counter.

8. A program input device according to claim 7 wherein the mode changing means comprises a control signal generator which generates control signals to incrementally count up the content of the address counter and to control the memory address gate means and an address gate circuit of the controller memory means.

9. A program input device according to claim 5 wherein the program transfer means further comprising gate means connected to the read-write memory and connectible to the data line and operable to be opened in the third transfer mode.

10. A program input device according to claim 9 wherein the program transfer means further comprises a memory data register for instantaneously memorizing the sequence program supplied from the read-write memory and the read-only memory, and a transfer circuit for converting the sequence program read out from the read-write memory to cause the sequence program to be stored in the read-only memory.

11. A program input device for a programmable sequence controller having controller memory means capable of removably containing at least one read-only memory for storing a sequence program comprising a series of instructions, each of the instructions comprising an operation code and address information, input means for selecting external inputs connected thereto in accordance with the instructions, operation control means for examining the selected external inputs in accordance with the instructions, and output means for selectively operating external outputs connected thereto in accordance with the instructions and with the results of the examinations performed by the operation control means, the program input device comprising:

a read-write memory capable of storing the sequence program, connecting means connectible to a read-only memory, program transfer means connected to the read-write memory and to the connecting means and connectible to the controller memory means and to a data line of the sequence controller for transferring the sequence program from the read-only memory contained in the controller memory means to the read-write memory in a first transfer mode and from the read-write memory to the read-only memory connected to the connecting means in a second transfer mode, program changing means for changing the sequence program stored in the read-write memory, and mode changing means selectively switchable to the first and second transfer modes for operating the program transfer means in one of the first and second transfer modes.

12. A program input device according to claim 11 wherein the connecting means is a plug-in memory socket for removably mounting the read-only memory.

13. A program input device according to claim 11 wherein the program transfer means comprises first address designation means for supplying an address information to both the controller memory means and the read-write memory when the first transfer mode is selected and to both the read-write memory and the connecting means when the second transfer mode is selected.

14. A program input device according to claim 13 wherein the controller memory means is capable of removably storing in addition to the first mentioned read-only memory another read-only memory for storing another sequence program, and wherein the program transfer means further comprises second address designation means for designating any one of the read-only memories contained within the controller memory means.

15. A program input device according to claim 14 wherein the first address designation means comprises a presettable address counter for generating the address information, and an address designation switch for presetting the address information to the address counter, and wherein the mode changing means comprises a control signal generator which generates control signals to incrementally count up the content of the address counter when any one of the first and second transfer modes is selected.

16. A program input device according to claim 13 wherein the program transfer means further comprises gate means connectable to the data line and operable to be opened for transmitting the sequence program from the data line to the read-write memory when the first transfer mode is selected.

* * * * *